United States Patent
Lin et al.

(10) Patent No.: US 7,919,802 B2
(45) Date of Patent: Apr. 5, 2011

(54) MIM CAPACITOR STRUCTURE AND FABRICATING METHOD THEREOF

(75) Inventors: Chun-Yi Lin, Hsin-Chu Hsien (TW); Chien-Chou Hung, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 217 days.

(21) Appl. No.: 11/748,481

(22) Filed: May 14, 2007

(65) Prior Publication Data

US 2007/0212845 A1 Sep. 13, 2007

Related U.S. Application Data

(62) Division of application No. 10/907,448, filed on Apr. 1, 2005, now Pat. No. 7,300,840.

(51) Int. Cl.
*H01L 27/108* (2006.01)
(52) U.S. Cl. .................. 257/303; 257/E21.647
(58) Field of Classification Search ........... 257/303, 257/E21.647
See application file for complete search history.

(56) References Cited

U.S. PATENT DOCUMENTS

| | | | |
|---|---|---|---|
| 6,081,021 A * | 6/2000 | Gambino et al. | 257/530 |
| 6,232,197 B1 | 5/2001 | Tsai | |
| 6,504,205 B1 * | 1/2003 | Hsue et al. | 257/306 |
| 6,596,581 B2 * | 7/2003 | Park et al. | 438/253 |
| 6,746,914 B2 | 6/2004 | Kai | |
| 2003/0211731 A1 * | 11/2003 | Kai et al. | 438/638 |

* cited by examiner

*Primary Examiner* — Bradley K Smith
*Assistant Examiner* — Amar Movva
(74) *Attorney, Agent, or Firm* — Winston Hsu; Scott Margo

(57) ABSTRACT

A method for fabricating an MIM capacitor is disclosed. First, a substrate is provided having a first dielectric layer thereon. Next at least one first damascene conductor is formed within the first dielectric layer, and a second dielectric layer with a capacitor opening is formed on the first dielectric layer, in which the capacitor opening is situated directly above the first damascene conductor. Next, an MIM capacitor having a top plate and a bottom plate is created within the capacitor opening, in which the bottom plate of the MIM capacitor is electrically connected to the first damascene conductor. Next, a third dielectric layer is deposited on the second dielectric layer and the MIM capacitor, and at least one second damascene conductor is formed within part of the third dielectric layer, in which the second damascene conductor is electrically connected to the top plate of the MIM capacitor.

10 Claims, 5 Drawing Sheets

MIM CAPACITOR STRUCTURE AND FABRICATING METHOD THEREOF

CROSS REFERENCE TO RELATED APPLICATIONS

This application is a division of U.S. application Ser. No. 10/907,448 filed Apr. 1, 2005, and incorporated herein by reference in its entirety.

BACKGROUND OF THE INVENTION

1. Field of the Invention

The present invention relates to a method for fabricating a capacitor, and more particularly, to a method for fabricating a metal-insulator-metal capacitor.

2. Description of the Prior Art

The manufacturing of semiconductor devices frequently requires the creation of electrical components that collectively perform functions of data manipulation (logic functions) or functions of data retention (storage functions). Most semiconductor devices are devices that perform binary logic functions that are reflected by on or off-mode conditions of binary circuits. It is therefore not uncommon to see a mixture of electrical components and functions, comprising semiconductor devices, resistors, and capacitors. The majority of semiconductor components consists of transistors, gate electrodes, and a variety of switching components for the performance of logic processing functions. Capacitors may form a basic component of analog circuits in for instance switched capacitor filters. Capacitors are further widely applied in digital applications such as the storage node for Dynamic Random Access Memory (DRAM) circuits.

A capacitor may be used as part of analog processing capabilities and in digital circuits, the capacitor is used to provide charge storage locations for individual bits of digital data that are stored in the digital Integrated Circuit (IC). The conventional process of creating a capacitor in combination with the creation of a CMOS device is a relatively complex and expensive process. Hence, a Metal-Insulator-Metal (MIM) capacitor that can be applied for mix-mode applications, is often used as a relatively simple and therefore cost effective method of creating a capacitor.

U.S. Pat. No. 6,746,914 shows a method of applying the damascene processes as part of the creation of an MIM capacitor. Please refer to FIG. 1. FIG. 1 shows a cross section of a conventional MIM capacitor. According to the conventional method, a substrate 10 is first provided, in which semiconductor devices have been created in or over the surface of the substrate. Next, a first dielectric layer 12 is disposed over the surface of the substrate 10. Next, a first dual damascene conductor 14 and a second dual damascene conductor 16 are created through the first dielectric layer 12. Next, an MIM capacitor is formed over the surface of the first dual damascene conductor 14, in which the MIM capacitor includes a bottom plate 18, an insulating layer 20, and a top plate 22. Next, an etch stop layer 24 is deposited on the first dielectric layer and the MIM capacitor, and a second dielectric layer 26 is then deposited thereon. A third dual damascene conductor 28 and a fourth dual damascene conductor 30 are formed through the second dielectric layer 26, in which the third dual damascene conductor 28 is aligned with the MIM capacitor and the fourth dual damascene conductor 30 is aligned with the second dual damascene conductor 16. Finally, a chemical mechanical polishing (CMP) process is performed for polishing the surface of the second dielectric layer and removing excess metal from the surface.

Despite the fact that the conventional method is able to successfully create an MIM capacitor with the incorporation of dual damascene processes, the fabrication of multiple dual damascene conductors is nevertheless complex, hence how to simplify the fabrication process of MIM capacitors and improve its overall efficiency and performance has become a widely studied topic in this field.

SUMMARY OF THE INVENTION

It is therefore a primary objective of the present invention to provide a method of fabricating an MIM capacitor between two single damascene conductors for improving the overall performance.

According to the present invention, a method for fabricating an MIM capacitor is disclosed. First, a substrate is provided having a first dielectric layer thereon. Next at least one first damascene conductor is formed within the first dielectric layer, and a second dielectric layer with a capacitor opening is formed on the first dielectric layer, in which the capacitor opening is situated directly above the first damascene conductor. Next, an MIM capacitor having a top plate and a bottom plate is created within the capacitor opening, in which the bottom plate of the MIM capacitor is electrically connected to the first damascene conductor. Next, a third dielectric layer is deposited on the second dielectric layer and the MIM capacitor, and at least one second damascene conductor is formed within part of the third dielectric layer and on the MIM capacitor, in which the second damascene conductor is electrically connected to the top plate of the MIM capacitor.

Another objective of the present invention is to provide an MIM capacitor structure, in which the comprising: a substrate; a first dielectric layer on the substrate; at least one first damascene conductor within the first dielectric layer; a second dielectric layer on the first dielectric layer, wherein the second dielectric layer further comprises an MIM capacitor formed directly above a first damascene conductor; a third dielectric layer on the second dielectric layer and the MIM capacitor; and at least one second damascene conductor within part of the third dielectric layer, and on the MIM capacitor.

By forming an MIM capacitor between two single damascene conductors, the present invention is able to effectively reduce the complexity of the entire fabrication process and improve the overall performance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
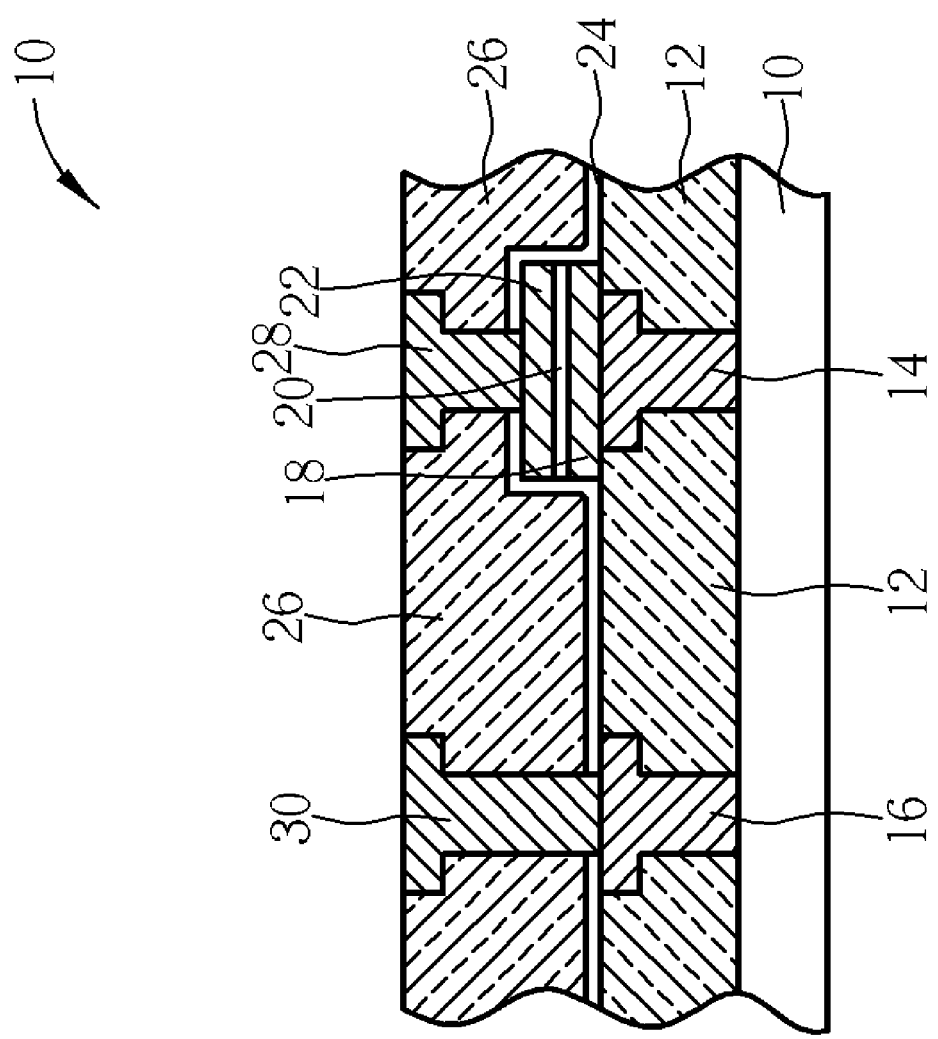
FIG. 1 is a cross section diagram showing a conventional MIM capacitor.
Figure 2:
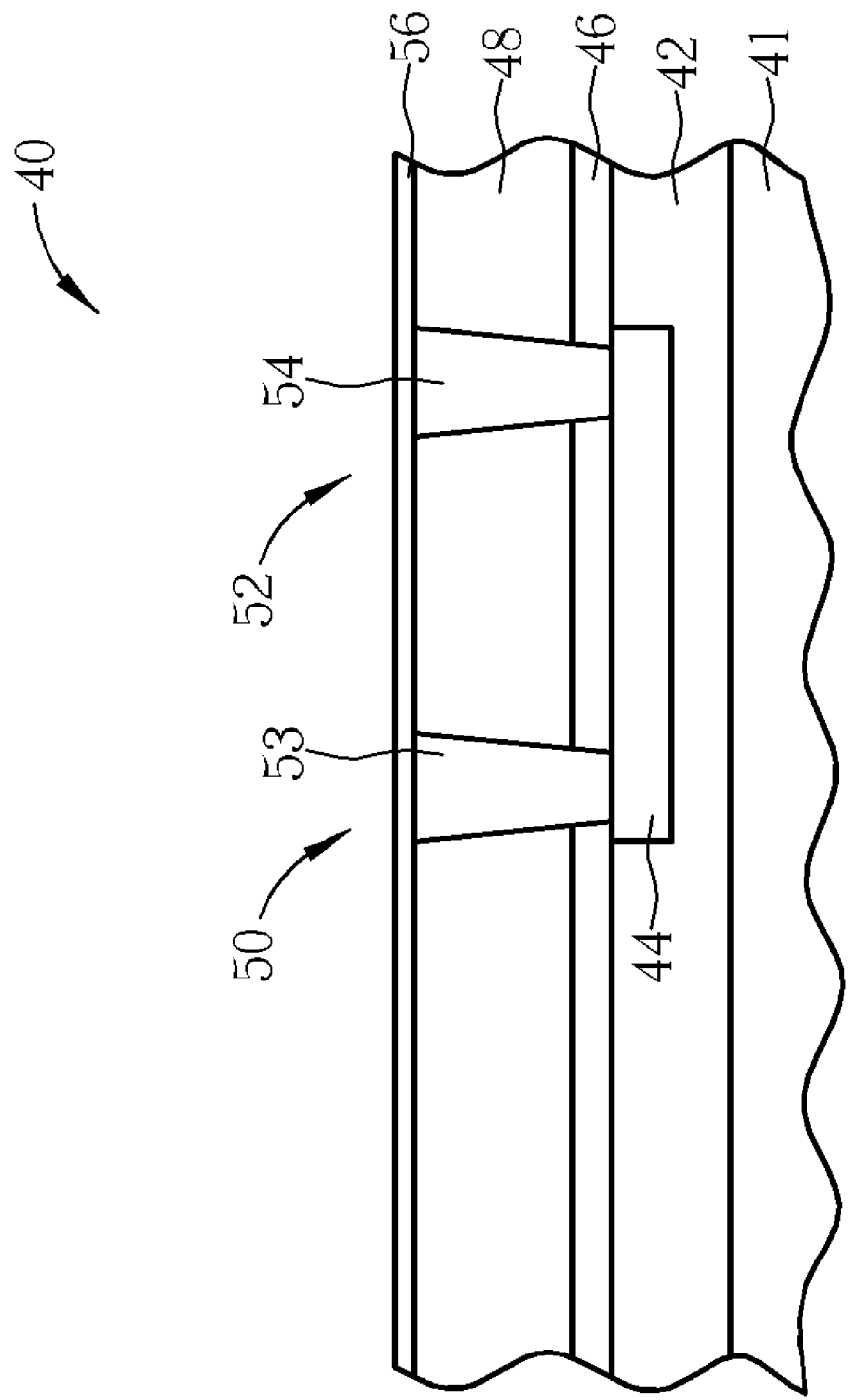
FIG. 2 through FIG. 5 are diagrams showing a method of applying dual damascene processes for fabricating an MIM capacitor structure according to the present invention.

Please refer to FIG. 2 through FIG. 5. FIG. 2 through FIG. 5 are diagrams showing a method of applying dual damascene processes for fabricating an MIM capacitor structure according to the present invention. As shown in FIG. 2, a substrate 41 is provided over the surface of a semiconductor die 40, and an interlayer dielectric 42 is formed on top of the substrate 41. In addition, a metal interconnect 44 fabricated by a dual damascene process is included in between the substrate 41 and the interlayer dielectric 42 for electrically connecting the capacitor and other conductors formed afterwards. Next, a silicon nitride (SiN) layer 46 is form over the exposed surface of the interlayer dielectric 42 and the metal interconnect 44. The silicon nitride layer 46 essentially serves as an etch stop layer and, although silicon nitride has been cited as the preferred material, the layer maybe deposited using a material that comprises a silicon component, for instance dielectrics such as silicon dioxide or silicon oxynitride. Next, a first dielectric layer 48 is deposited over the surface of the silicon nitride layer 46. Preferably, the first dielectric layer 48 is comprised of silicon dioxide, silicon oxynitride, spin-on-glass, or plasma oxide. Next, a first photoresist pattern (not shown) is formed on the first dielectric layer 48 for defining the via pattern of a dual damascene structure. Next, an anisotropic etching process is performed to etch a first via opening 50 and a second via opening 52 within the first dielectric layer, and an electroplating process and a chemical mechanical polishing (CMP) process are then performed to deposit copper metals into the first and second via openings 50, 52 for forming a first damascene conductor 53 and a second damascene conductor 54. Next, another silicon nitride layer 56 is deposited over the exposed surface of the first dielectric layer 48 and the first damascene conductor 53 and the second damascene conductor 54. As part of a dual damascene structure, the first damascene conductor 53 and the second damascene conductor 54 also serve as via conductors of the MIM capacitor structure.

Figure 3:
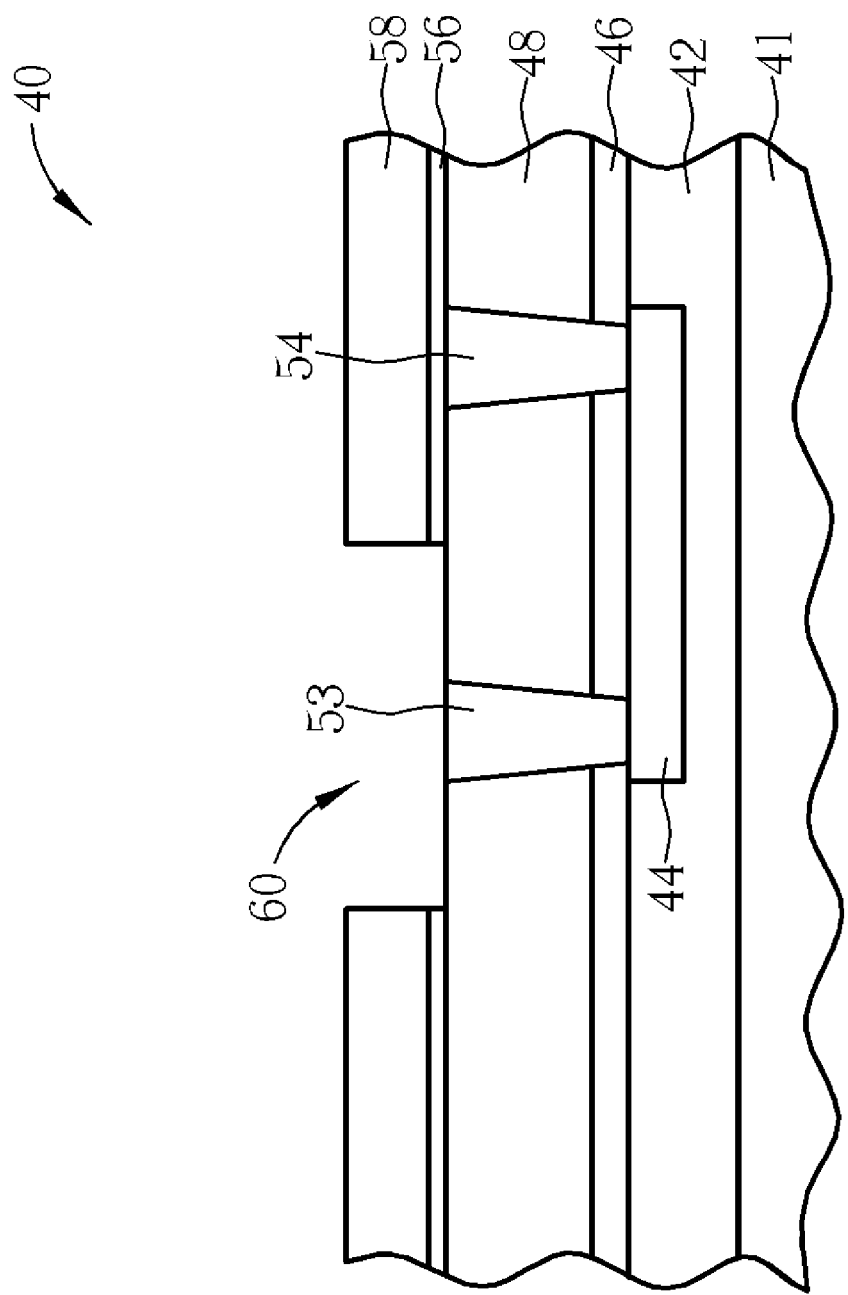

As shown in FIG. 3, a second dielectric layer 58 is deposited over the surface of the silicon nitride layer 56, and an etching process is performed to etch the second dielectric layer 58 and the silicon nitride layer 56 for creating a capacitor opening 60, in which the capacitor opening 60 is situated directly above the first damascene conductor 53.

Figure 4:
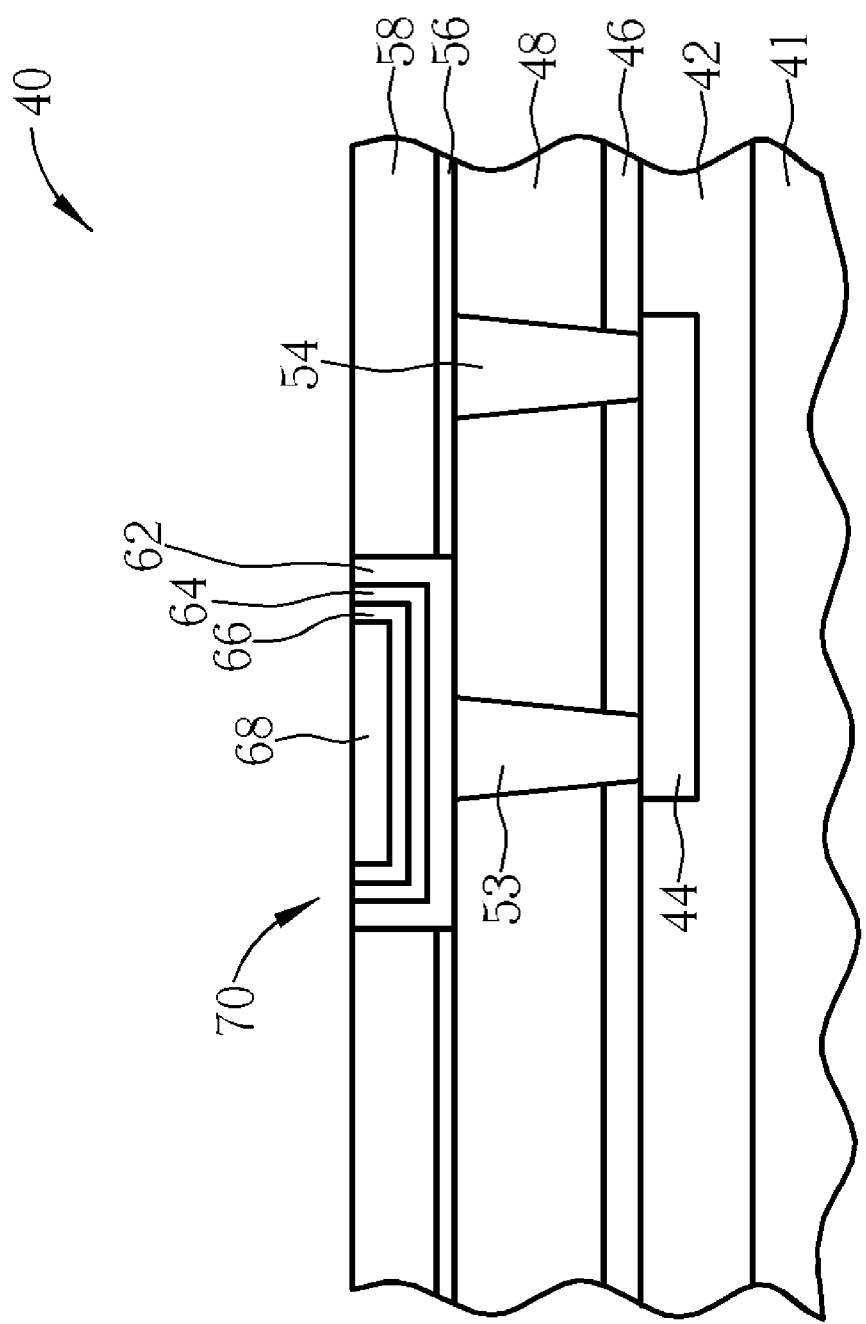

As shown in FIG. 4, an MIM capacitor 70 is created by forming a first capacitor conductive layer 62 on the sidewall and bottom of the capacitor opening 60, an insulating layer 64 on the first capacitor conductive layer 62, and a second capacitor conductive layer 66 on the insulating layer 64, in which the first capacitor conductive layer 62 is served as the bottom plate of the MIM capacitor 70 and the second capacitor conductive layer 66 is served as the top plate of the MIM capacitor 70. As shown in the figure, the bottom plate of the MIM capacitor 70 is also electrically connected to the first damascene conductor 53. In most cases, materials that may be considered for the creation of the bottom and top plate of an MIM capacitor are tantalum (Ta), tantalum nitride (TaN), titanium (Ti), or titanium nitride (TiN), whereas materials that can be used as the insulating layer 64 are oxide-nitride-oxide (ONO), aluminum oxide (ex. $Al_2O_3$), tantalum oxide (ex. $Ta_2O_5$), or hafnium oxide (ex. $HfO_2$). Next, a stop layer 68, which can be another silicon nitride layer, is deposited on top of the second capacitor conductive layer 66, such that the stop layer 68 also fills the capacitor opening 60 completely. A chemical mechanical polishing process is then performed for polishing the stop layer 68, the second capacitor conductive layer 66, the insulating layer 64, and the first capacitor conductive layer 62 to the surface of the second dielectric layer 58 and providing good planarity to the surface. Alternatively, the stop layer 68 can be substituted by utilizing the second conductive layer 66 to fill the capacitor opening 60 completely, such that the chemical mechanical polishing process can be performed directly on the second capacitor conductive layer 66, the insulating layer 64, and the first capacitor conductive layer 62 for providing a planarized surface.

Figure 5:
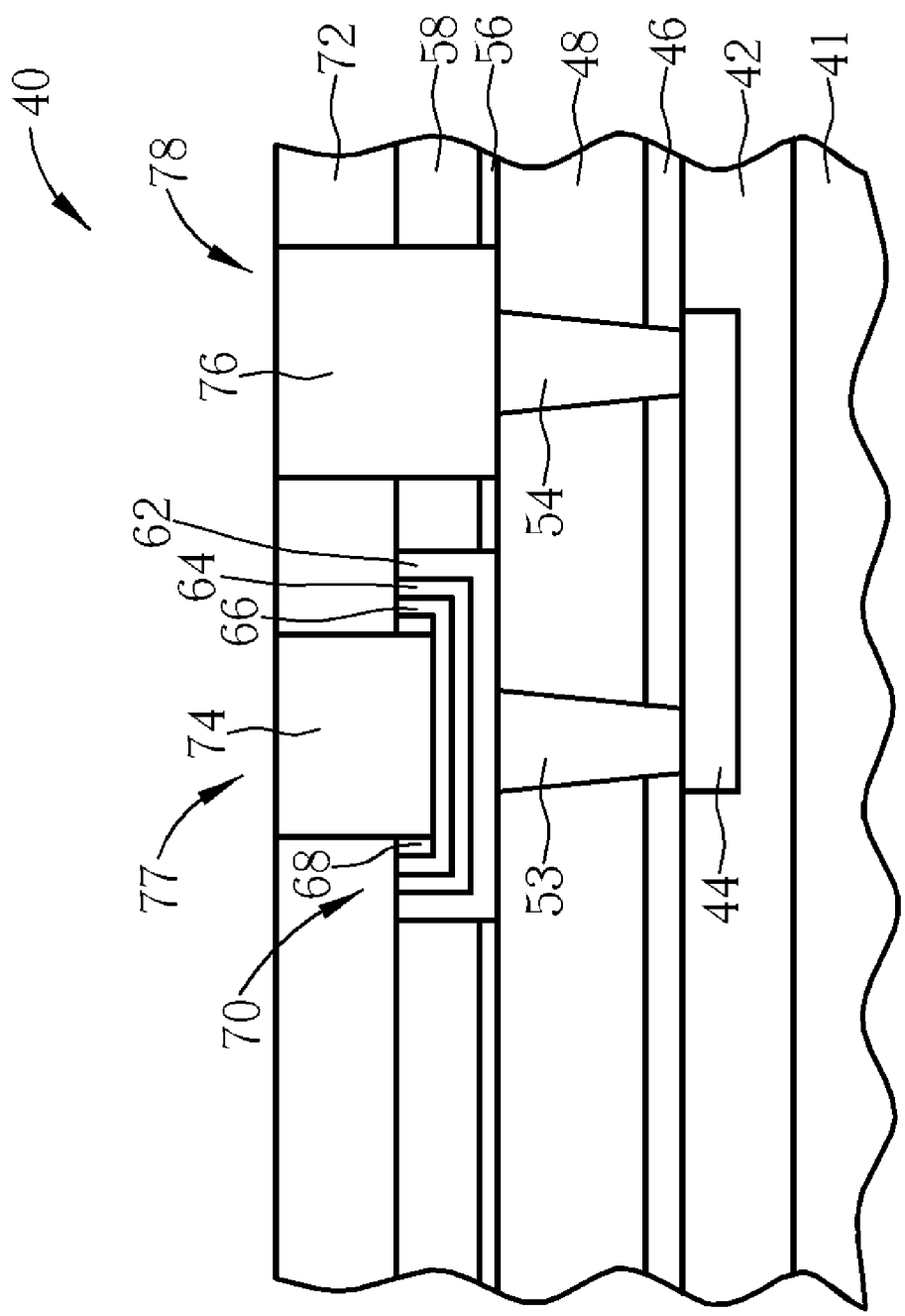

As shown in FIG. 5, a third dielectric layer 72 is deposited over the surface of the second dielectric layer 58 and the MIM capacitor 70. An etching process is then performed to simultaneously etch the third dielectric layer 72, the stop layer 68, the second dielectric layer 58, and the silicon nitride layer 56 for creating a first trench opening 77 and a second trench opening 78. Next, an electroplating process is performed to deposit copper metals into the first and second trench openings 77, 78 for forming a third damascene conductor 74 and a fourth damascene conductor 76, in which the third damascene conductor 74 is electrically connected to the top plate of the MIM capacitor 70 and the fourth damascene conductor 76 and the second damascene conductor 54 together form a dual damascene conductor.

According to FIG. 5, the present invention also discloses an MIM capacitor structure, in which the structure includes a substrate 41, an interlayer dielectric 42 on the substrate 41, a metal interconnect 44 within the interlayer dielectric 42, a first dielectric layer 48 on the substrate 41, at least a first damascene conductor 53 within the first dielectric layer 48, a second dielectric layer 58 on the first dielectric layer 48, in which the second dielectric layer 58 further includes an MIM capacitor 70 formed directly above the first damascene conductor 53, a third dielectric layer 72 on the second dielectric layer 58 and the MIM capacitor 70, and at least a third damascene conductor 74 within part of the third dielectric layer 72 and on the MIM capacitor 70. Additionally, the MIM capacitor 70 includes a first capacitor conductive layer 62 on the sidewall and bottom of the capacitor opening, an insulating layer 64 on the sidewall and bottom of the first conductive layer 62, and a second capacitor conductive layer 66 on the sidewall and bottom of the insulating layer 64, in which the first capacitor conductive layer 62 is served as the bottom plate of the MIM capacitor 70 and the second conductive layer 66 is served as the top plate of the MIM capacitor 70. As shown in the figure, the first damascene conductor 53 and the second damascene conductor 54 are via conductors whereas the third damascene conductor 74 and the fourth damascene conductor 76 are trench conductors. Evidently, the present invention discloses a concave MIM capacitor 70, in which the MIM capacitor 70 is sandwiched between a trench conductor and a via conductor.

In contrast to the conventional method of sandwiching an MIM capacitor with two dual damascene conductors, the present invention utilizes a different approach by forming an MIM capacitor between two single damascene conductors, in which one of the damascene conductors being a via conductor whereas the other conductor being a trench conductor. Additionally, the present invention discloses a concave MIM capacitor that is capable of providing a greater surface area than the conventional MIM capacitor, thereby increasing the overall capacitance of the MIM capacitor. By decreasing the number of damascene conductors, the present invention is able to reduce the number of photoresist masks utilized during standard damascene fabrication processes, thereby effectively reducing the complexity of the entire fabrication process and improving the overall performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An MIM capacitor structure, comprising:
a substrate;
a first dielectric layer on the substrate;

at least one first damascene conductor within the first dielectric layer;

a second dielectric layer on the first dielectric layer, wherein the second dielectric layer further comprises an MIM capacitor formed directly above a first damascene conductor, such that the top surface of the MIM capacitor is even with the top surface of the second dielectric layer;

a third dielectric layer on the second dielectric layer and the MIM capacitor;

at least one second damascene conductor within part of the third dielectric layer, and on the MIM capacitor; and a stop layer disposed between the MIM capacitor and the second damascene conductor, wherein the top of the stop layer is even with the top of the MIM capacitor.

2. The MIM capacitor structure of claim 1, wherein the first damascene conductor is a via conductor.

3. The MIM capacitor structure of claim 1, wherein the first damascene conductor and the second damascene conductor are copper conductors.

4. The MIM capacitor structure of claim 1, wherein the MIM capacitor further comprising:

a first capacitor conductive layer on the sidewall and bottom of the capacitor opening;

an insulating layer on the sidewall and bottom of the first capacitor conductive layer; and a second capacitor conductive layer on the sidewall and bottom of the insulating layer.

5. The MIM capacitor structure of claim 4, wherein the first capacitor conductive layer is the bottom plate of the MIM capacitor.

6. The MIM capacitor structure of claim 4, wherein the second capacitor conductive layer is the top plate of the MIM capacitor.

7. The MIM capacitor structure of claim 4, wherein the first capacitor conductive layer comprises a U-shaped first capacitor conductive layer and the insulating layer comprises a U-shaped insulating layer.

8. The MIM capacitor structure of claim 7, wherein the second capacitor conductive layer comprises a U-shaped second capacitor conductive layer.

9. The MIM capacitor structure of claim 1 further comprising an interlayer dielectric layer between the substrate and the first dielectric layer.

10. The MIM capacitor structure of claim 9, wherein a metal interconnect is within the interlayer dielectric for connecting to the MIM capacitor.

* * * * *